(12) United States Patent
Usui et al.

(10) Patent No.: US 7,553,164 B2
(45) Date of Patent: Jun. 30, 2009

(54) CIRCUIT DEVICE AND METHOD OF MANUFACTURING THE SAME

(75) Inventors: Ryosuke Usui, Aichi (JP); Hideki Mizuhara, Aichi (JP); Yasunori Inoue, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 211 days.

(21) Appl. No.: 11/416,083

(22) Filed: May 1, 2006

(65) Prior Publication Data
US 2006/0267189 A1 Nov. 30, 2006

(30) Foreign Application Priority Data
May 30, 2005 (JP) .............................. P2005-158070
May 31, 2005 (JP) .............................. P2005-159165

(51) Int. Cl.
*H05K 1/14* (2006.01)
(52) U.S. Cl. .............................. 439/65; 439/67; 439/77; 361/748; 361/749
(58) Field of Classification Search .................. 29/825, 29/829–834, 841; 257/690, 698–700, 702; 361/748, 749; 439/67, 77
See application file for complete search history.

(56) References Cited

U.S. PATENT DOCUMENTS

| | | | | |
|---|---|---|---|---|
| 4,891,984 A | * | 1/1990 | Fujii et al. | 73/514.33 |
| 4,947,236 A | * | 8/1990 | Suga et al. | 257/421 |
| 5,783,748 A | * | 7/1998 | Otani | 73/493 |
| 6,492,698 B2 | * | 12/2002 | Kim et al. | 257/432 |
| 7,071,685 B2 | * | 7/2006 | Saltsov et al. | 324/240 |
| 7,075,794 B2 | * | 7/2006 | Gall et al. | 361/749 |
| 2003/0070483 A1 | * | 4/2003 | Mueller | 73/493 |
| 2004/0245997 A1 | * | 12/2004 | Plotnikov et al. | 324/529 |
| 2007/0101812 A1 | * | 5/2007 | MacGugan | 73/493 |

FOREIGN PATENT DOCUMENTS

| | | | | |
|---|---|---|---|---|
| JP | 2004186460 A | * | 7/2004 | |
| JP | 2004-361175 | | 12/2004 | |
| JP | 2005129904 A | * | 5/2005 | |

* cited by examiner

*Primary Examiner*—David A. Rogers
(74) *Attorney, Agent, or Firm*—Fish & Richardson P.C.

(57) ABSTRACT

A circuit device of the present invention includes a first element which is placed parallel to a first reference plane and which senses a physical quantity, and a second element placed parallel to a second reference plane which intersects the first reference plane at a predetermined angle. The circuit device further includes a sealing resin for integrally sealing the first and second elements, a first conductive pattern which is electrically connected to the first element and placed parallel to the first reference plane and which has a back surface exposed from the sealing resin, and a second conductive pattern which is electrically connected to the second element and placed parallel to the second reference plane and which has a back surface exposed from the sealing resin.

4 Claims, 9 Drawing Sheets

CIRCUIT DEVICE AND METHOD OF MANUFACTURING THE SAME

Priority is claimed to Japanese Patent Application Numbers JP2005-159165, filed on May 31, 2005, and JP2005-158070, filed on May 30, 2005, the disclosure of which are incorporated herein by reference in its entireties.

BACKGROUND OF THE INVENTION

1. Field of the Invention

The present invention relates to a circuit device and a method of manufacturing the same. In particular, the present invention relates to a circuit device in which a plurality of elements including a sensor are incorporated and a method of manufacturing the same.

2. Description of the Related Art

Heretofore, gyro sensors have been used as an angular velocity sensor for a hand shake prevention in a video camera or the like or for a position detection. A detection of a hand shake occurring in a video camera using a gyro sensor and a correction of a picture in accordance with a degree of the detected hand shake make it possible to reduce an adverse influence of the hand shake on the picture. In a case where a gyro sensor is incorporated in a set such as a video camera, the gyro sensor is fixed to the inside of an enclosure of the set or to a mounting board incorporated therein. Moreover, gyro sensors are also used for an attitude control and the like for ships, aircrafts, automobiles, and the like.

Referring to FIG. 9, a description will be given of one example of a structure in which a gyro sensor is attached to a mounting board. This technology is described for instance in Japanese Patent Application Publication No. 2004-361175. Here, a circuit device 100 having a sensing element 101 incorporated therein, which is a gyro sensor, is fixed to a surface of a mounting board 108. To three-dimensionally detect a hand shake, angular velocities need to be detected in both horizontal and vertical directions. In a case where the mounting board 108 is placed horizontally, an element having a reference plane in the horizontal direction can be fixed directly to the mounting board 108. However, it is difficult to mount an element having a reference plane in the vertical direction directly to the mounting board 108. Accordingly, in Japanese Patent Application Publication No. 2004-361175, an element having a reference plane in the vertical direction is packaged to be fixed to the mounting board 108.

The circuit device 100 is the sensing element 101 molded in a resin, and has leads 105 which are extended downward and electrically connected to the sensing element 101. On the outside of the circuit device 100, a largest surface 104 is formed which is parallel to a reference plane 103 of the sensing element 101. Here, the reference plane 103 is a plane orthogonal to a detection axis 102 of the sensing element 101. The sensing element 101, which is a gyro sensor, can determine an angular velocity about the detection axis 102.

The circuit device 100 has been fixed to the mounting board 108 by inserting the leads 105 into lead holes 106 which are provided to penetrate the mounting board 108. Here, the reference plane 103 is fixed at a right angle with respect to the surface of the mounting board 108. The leads 105 are connected to conducting paths 107 formed on the surface of the mounting board 108.

However, in the above-described invention described in Japanese Patent Application Publication No. 2004-361175, the sensing element 101 is fixed as an individual package to the surface of the mounting board 108. Accordingly, there has been a problem that an area necessary to mount the circuit device 100 becomes large. This has inhibited a miniaturization of a set, such as a video camera, in which the sensing element 101 is incorporated.

Further, in the circuit device 100, there has been a problem that a connection reliability becomes low at positions where the leads 105 are inserted in the mounting board 108. Specifically, the circuit device 100 incorporating the sensing element 101 has been fixed to the mounting board 108 through the leads 105 extended from the circuit device 100. Accordingly, large thermal stresses act on the leads 105 connecting the circuit device 100 and the mounting board 108. Thus, there has been a problem that a connection reliability of the leads 105 becomes low.

SUMMARY OF THE INVENTION

The present invention has been accomplished in a view of the above-described problems. The present invention provides a circuit device and a method of manufacturing the same which contribute to a miniaturization and a connection reliability improvement.

A circuit device of the present invention is a circuit device that includes a first element placed at a predetermined angle with respect to a first reference plane, the first element sensing a physical quantity, and a second element placed at a predetermined angle with respect to a second reference plane intersecting the first reference plane, wherein the first and second elements are integrally sealed with a resin.

Furthermore, a circuit device of the present invention is a circuit device including a first element placed at a predetermined angle with respect to a first reference plane, the first element sensing a physical quantity, a second element placed at a predetermined angle with respect to a second reference plane intersecting the first reference plane, a sealing resin for integrally sealing the first and second elements, a first conductive pattern electrically connected to the first element and placed at a predetermined angle with respect to the first reference plane, the first conductive pattern having a back surface exposed from the sealing resin, and a second conductive pattern electrically connected to the second element and placed at a predetermined angle with respect to the second reference plane, the second conductive pattern having a back surface exposed from the sealing resin.

Furthermore, a method of manufacturing a circuit device of the present invention includes forming a first conductive pattern and a second conductive pattern in a conductive substrate in a recessed shape, the first conductive pattern extending at a predetermined angle with respect to a first reference plane, the second conductive pattern extending at a predetermined angle with respect to a second reference plane intersecting the first reference plane, electrically connecting a first element for sensing a physical quantity to the first conductive pattern so that the first element is placed at a predetermined angle with respect to the first reference plane, electrically connecting a second element to the second conductive pattern so that the second element is placed at a predetermined angle with respect to the second reference plane, forming a sealing resin to coat the first and second elements, and removing a back surface of the conductive substrate to isolate individual portions of the first and second conductive patterns from each other.

Furthermore, a method of manufacturing a circuit device of the present invention includes forming an isolating groove in a surface of a conductive foil and forming conductive patterns, fixing elements to the conductive patterns and electrically connecting the elements to the conductive patterns, bending the conductive foil at a position where the isolating groove is provided, forming a sealing resin to coat the elements and fill the isolating groove, and removing the conductive foil from a back surface thereof until the sealing resin filling the isolating groove is exposed.

Furthermore, a method of manufacturing a circuit device of the present invention includes forming first isolating grooves from a surface of a conductive foil to form a first conductive pattern and a second conductive pattern, and providing a second isolating groove from the surface of the conductive foil in a portion thereof to be bent, electrically connecting a first element for sensing a physical quantity to the first conductive pattern, and connecting a second element to the second conductive pattern, bending the conductive foil at a position where the second isolating groove is provided, forming a sealing resin to coat both the elements and fill the first and second isolating grooves, and removing the conductive foil from a back surface thereof until the sealing resin filling the first and second isolating grooves is exposed.

BRIEF DESCRIPTION OF THE DRAWINGS

FIG. 1A is a perspective view, and FIG. 1B is a cross-sectional view.

DESCRIPTION OF THE PREFERRED EMBODIMENTS

Hereinafter, embodiments of the present invention will be described with reference to drawings.

First Embodiment

Figure 1A:
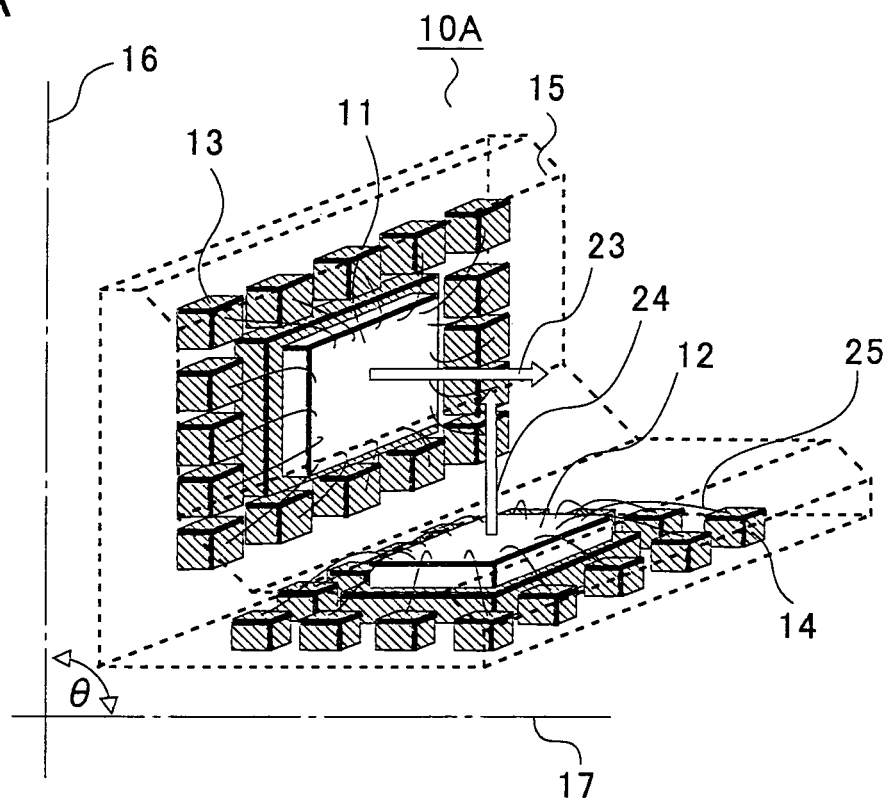
FIGS. 1A and 1B are views showing a circuit device of embodiments of the present invention.

A constitution of a circuit device 10A will be described with reference to FIGS. 1A and 1B. FIG. 1A is a perspective view of the circuit device 10A, and FIG. 1B is a representative cross-sectional view of FIG. 1A.

Figure 1B:
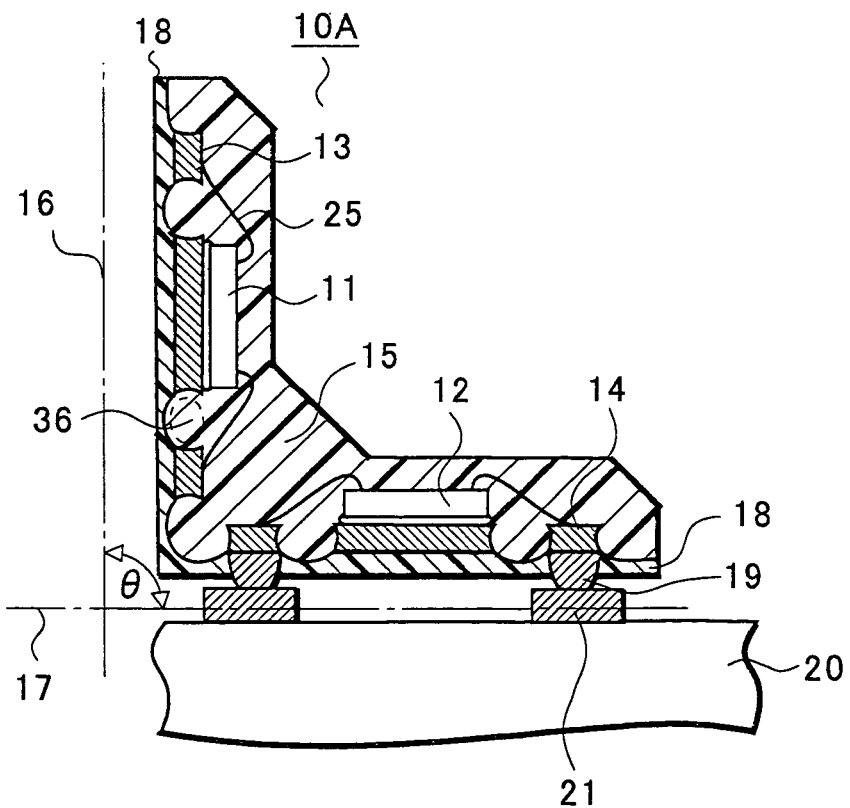

Referring to FIGS. 1A and 1B, the circuit device 10A includes a first element 11 placed parallel to a first reference plane 16 and a second element 12 placed parallel to a second reference plane 17. The first element 11 is electrically connected to a first conductive pattern 13 extending parallel to the first reference plane 16. The second element 12 is electrically connected to a second conductive pattern 14 extending parallel to the second reference plane 17. The first and second conductive patterns 13 and 14 are buried in a sealing resin 15 in a state in which back surfaces thereof are exposed.

As the first element 11, an element can be employed which can detect a physical quantity such as a displacement, a motion, a pressure, a gravity, a geomagnetism, an impact, a velocity, an acceleration, or an angular velocity. In this embodiment, as one example, a description will be given by employing as the first element 11 a gyro sensor which detects an angular velocity.

The first element 11, which is a gyro sensor, has a hollow structure, and components including a quartz resonator element are incorporated therein. In these drawings, the first element 11 is placed upright in a vertical direction. Thus, the first element 11 can detect an angular velocity (rotational speed) about a first detection axis 23 orthogonal to the first reference plane 16. That is, a degree of a rotation in the vertical direction in these drawings is detected by the first element 11.

The first conductive pattern 13 is buried in the sealing resin 15 so that the back surface thereof is exposed as described previously, and is electrically connected to the first element 11, which is a gyro sensor. Here, the first conductive pattern 13 includes a die pad to which the first element 11 is fixed and bonding pads to which thin metal wires 25 are connected. Individual portions of the first conductive pattern 13 are electrically isolated from each other by the sealing resin 15 filling isolating grooves 36.

As the second element 12, an element which can detect various kinds of physical quantities can be employed similarly to the first element 11. If a gyro sensor is employed as the second element 12, it becomes possible to detect an angular velocity in a direction different from that of the first element 11. Here, the second element 12 is placed horizontally. Accordingly, the second element 12 can detect an angular velocity about a second detection axis 24 extending in the vertical direction in these drawings. A degree of a rotation in a lateral direction in these drawings is detected by the second element 12.

Alternatively, an element other than a detecting element can also be employed as the second element 12. For example, a large scale integrated circuit (LSI) which processes an electric signal outputted by the first element 11 can also be employed as the second element 12. In this case, a wiring pattern 22 (see FIG. 2A) for connecting the first and second conductive patterns 13 and 14 is formed inside the circuit device 10A. The first and second elements 11 and 12 are electrically connected by this wiring pattern 22.

The first reference plane 16 is a plane to which a main surface of the first element 11 is placed parallel. Further, the first conductive pattern 13 to which the first element 11 is connected also extends parallel to the first reference plane 16. Here, the first reference plane 16 extends in the vertical direction (longitudinal direction) in these drawings.

The second reference plane 17 is a plane to which a main surface of the second element 12 and the second conductive pattern 14 are placed parallel. Here, the second reference plane 17 extends in the horizontal direction (lateral direction) in these drawings. The aforementioned second detection axis 24 extends perpendicular to the second reference plane 17.

The first and second reference planes 16 and 17 intersect at a predetermined angle ($\theta$). By setting the angle $\theta$, at which these reference planes intersect, to a right angle (90 degrees), angular velocities in the horizontal and vertical directions can be simultaneously detected using the first and second elements 11 and 12. Here, the angle $\theta$ may be less than 90 degrees or more than 90 degrees. The angle θ can be changed depending on types of circuit elements to be incorporated therein and a use thereof.

FIG. 1B shows a cross-sectional view for a case where the circuit device 10A is mounted on a mounting board 20. Here, exposed surfaces of the first and second conductive patterns 13 and 14 are coated with a coating resin 18. Further, the back surface of the second conductive pattern 14 in regions where external electrodes 19 are formed is exposed from the coating resin 18. Moreover, on the back surface of the second conductive pattern 14 in exposed portions, the external electrodes 19 are formed which are made of a conductive adhesive such as solder. The circuit device 10A is fixed to conducting paths 21 formed on a surface of the mounting board 20, through these external electrodes 19.

Here, the circuit device 10A is fixed to the conducting paths 21 formed on the surface of the mounting board 20 so that the second reference plane 17 becomes parallel to a main surface of the mounting board 20. Accordingly, the main surface of the second element 12 is placed parallel to the mounting board 20. In a case where the first and second reference planes 16 and 17 intersect at a right angle, the main surface of the first element 11 is placed perpendicular to the mounting board 20.

Fixing the circuit device 10A to the mounting board 20 in this way makes it possible to detect an angular velocity in a direction perpendicular to the main surface of the mounting board 20 in a case where the first element 11 is a gyro sensor. Further, in a case where both the first and second elements 11 and 12 are gyro sensors, it is possible to detect angular velocities in both directions parallel and perpendicular to the main surface of the mounting board 20.

The circuit device 10A incorporates a plurality of elements including the first element 11 placed perpendicular to a mounting surface. Accordingly, there is no need to prepare an individual package for mounting an element having a main surface (largest surface) placed perpendicular to the mounting board 20. Thus, the number of mounted components can be reduced, and the mounting board 20 can therefore be miniaturized.

Moreover, the circuit device 10A is fixed to the conducting paths 21 of the mounting board 20 through the external electrodes 19 attached to the exposed surfaces of the second conductive pattern 14. This eliminates a need to provide insertion holes in the mounting board 20 in order to fix the circuit device 10A, and can therefore simplify a constitution of the mounting board 20. Furthermore, the circuit device 10A can be mounted on the mounting board 20 with other components by a reflow process in which the external electrodes 19 are melted. Accordingly, a process for mounting the circuit device 10A can be simplified.

Although the main surface of the first element 11 is placed parallel to the first reference plane 16 in the above description, the main surface of the first element may be placed perpendicular to the first reference plane 16. Alternatively, the main surface of the first element may be placed to be tilted with respect to the first reference plane. This also applies to the main surface of the second element 12 and the second reference plane 17. Further, this matter also applies to positional relationships between the first conductive pattern 13 and the first reference plane 16 and between the second conductive pattern 14 and the second reference plane 17. Moreover, a relative positional relationship between the main surface of the first element 11 and the first reference plane 16 may be different from that between the main surface of the second element 12 and the second reference plane 17.

Next, constitutions of circuit devices having other constitutions will be described with reference to cross-sectional views of FIGS. 2A and 2B. Basic constitutions of the circuit devices shown in these drawings are the same as that of the circuit device 10A described with reference to FIGS. 1A and 1B.

Figure 2A:
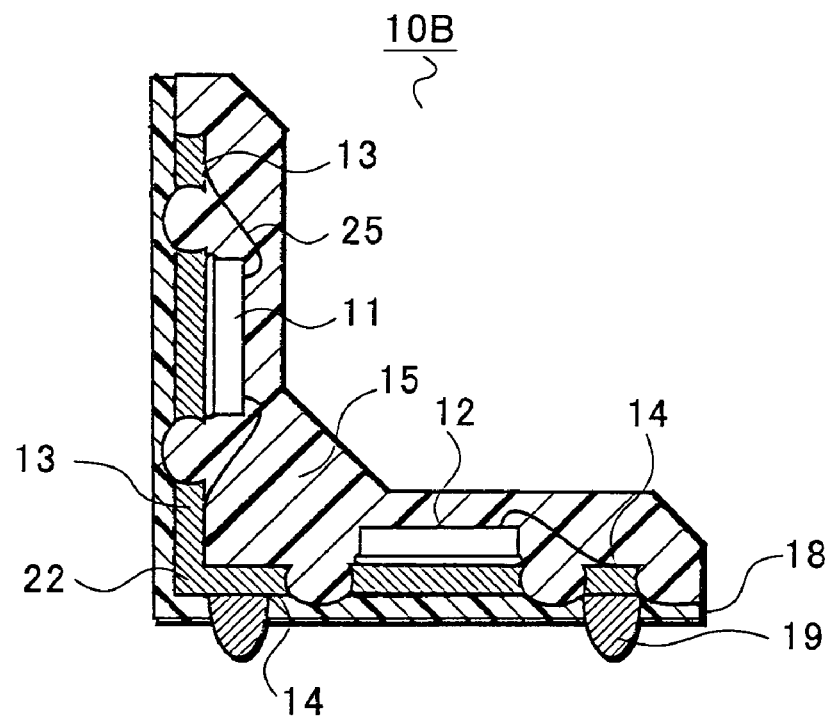
FIGS. 2A and 2B are cross-sectional views showing the circuit devices of the embodiments of the present invention.

Referring to FIG. 2A, in a circuit device 10B, a wiring pattern 22 is formed which extends so as to connect the first and second conductive patterns 13 and 14. The wiring pattern 22 extends from the first conductive pattern 13 to the second conductive pattern 14 in a bent shape.

Employing the wiring pattern 22 makes it possible to electrically connect the first and second elements 11 and 12. Accordingly, an angular-velocity-based electric signal outputted by the first element 11, which is a gyro sensor, can be processed by the second element 12, which is an LSI.

Further, employing the wiring pattern 22 also makes it possible to electrically connect the first element 11 and the second conductive pattern 14 having a back surface on which external electrodes are formed. Accordingly, an electric signal outputted by the first element 11 can be extracted to the outside of the circuit device 10B through the wiring pattern 22, the second conductive pattern 14, and the external electrode 19.

Figure 2B:
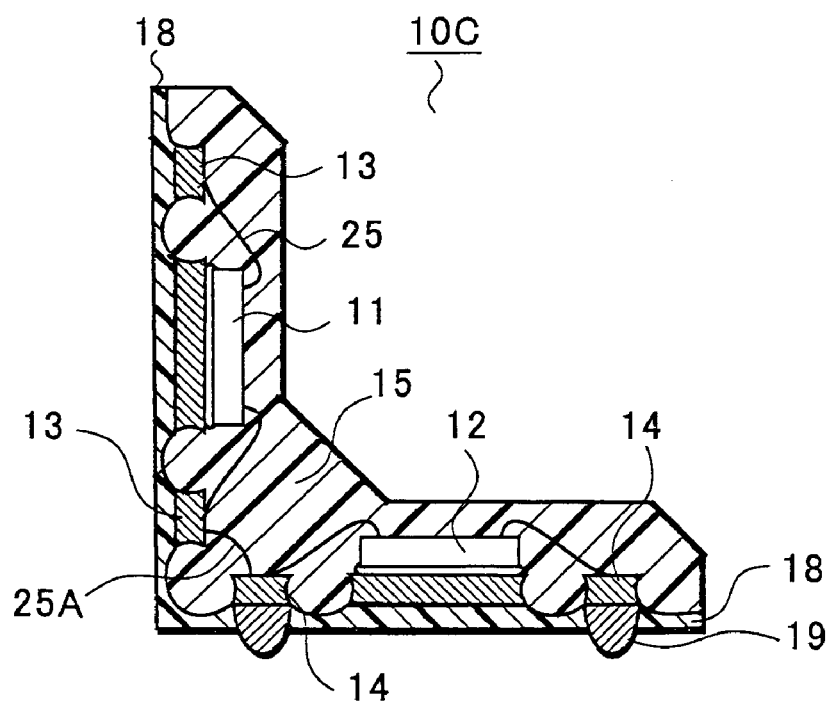

Referring to FIG. 2B, in a circuit device 10C, the first and second conductive patterns 13 and 14 are connected by a thin metal wire 25A. A function of the thin metal wire 25A here is the same as that of the above-described wiring pattern 22.

Second Embodiment

Next, a method of manufacturing the above-described circuit device will be described with reference to FIGS. 3A to 5C.

Figure 3A:
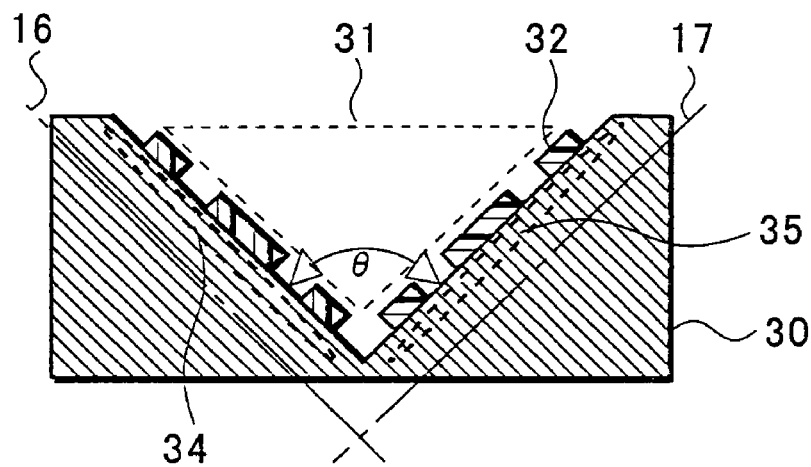
FIGS. 3A to 3C are cross-sectional views showing a circuit device manufacturing method of the embodiments of the present invention.

First, referring to FIG. 3A, plane surfaces on which conductive patterns can be formed are provided in a surface of a conductive substrate 30 in a recessed shape. Here, a recessed portion 31 is provided from the surface of the conductive substrate 30 so that two plane surfaces parallel to first and second reference planes 16 and 17 are formed. That is, a first plane surface 34 parallel to the first reference plane 16 is formed, and a second plane surface 35 parallel to the second reference plane 17 is formed. A formation of these plane surfaces results in the recessed portion 31 being formed in the surface of the conductive substrate 30. As a material for the conductive substrate 30, a metal is employed which contains Cu, Al, an Fe—Ni alloy, or the like. The above-described plane surfaces can be formed in the conductive substrate 30 by a grinding, an etching, or the like.

In a case where a first element to be mounted is placed perpendicular to a mounting surface, the first and second reference planes 16 and 17 are formed so as to be orthogonal (θ=90 degrees). Further, here, the first and second plane surfaces 34 and 35 are formed to have a left-right symmetry.

Moreover, the first and second plane surfaces 34 and 35 are coated with an etching resist 32 so that predetermined conductive patterns are formed.

Figure 3B:
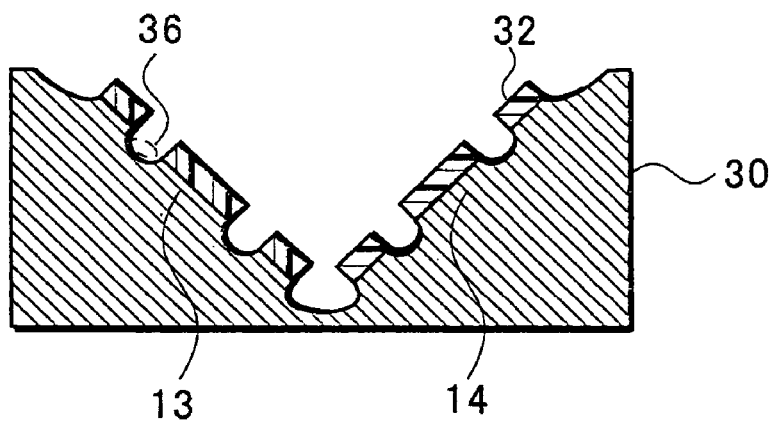

Next, referring to FIG. 3B, a wet etching is performed using the etching resist 32 as an etching mask. By this etching process, isolating grooves 36 are formed in the plane surfaces, and protruding conductive patterns are formed. Specifically, a first conductive pattern 13 is formed in the first plane surface 34 in a protruding shape. Further, a second conductive pattern 14 is formed in the second plane surface 35 in a protruding shape. After the etching is finished, the resist 32 is removed.

Figure 3C:
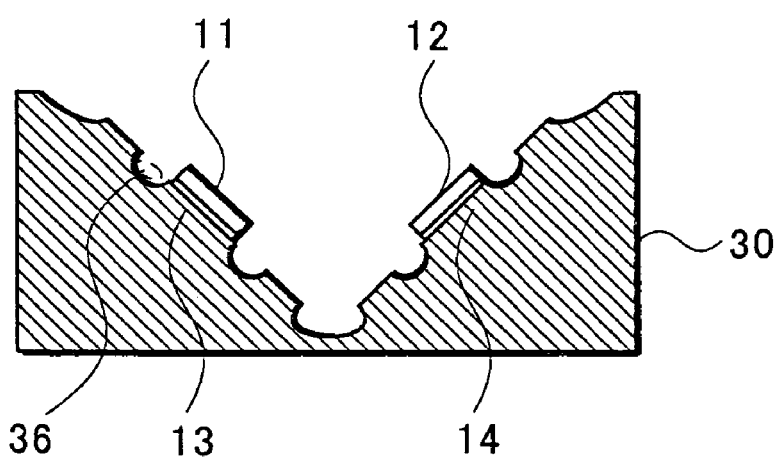

Next, referring to FIG. 3C, a first element 11 is fixed to the first conductive pattern 13, and a second element 12 is fixed to the second conductive pattern 14. Here, as the first and second elements 11 and 12, for example, elements, such as gyro sensors, which sense physical quantities, are employed. These elements are fixed to land-shaped portions of the conductive patterns with solder, a conductive paste, or an insulating adhesive interposed therebetween.

The first element 11 may be mounted in a state in which the first conductive pattern is kept tilted with respect to a horizontal plane, or may be mounted after the first conductive pattern is made parallel to the horizontal plane by tilting the entire conductive substrate 30. This also applies to a mounting of the second element 12.

Figure 4A:
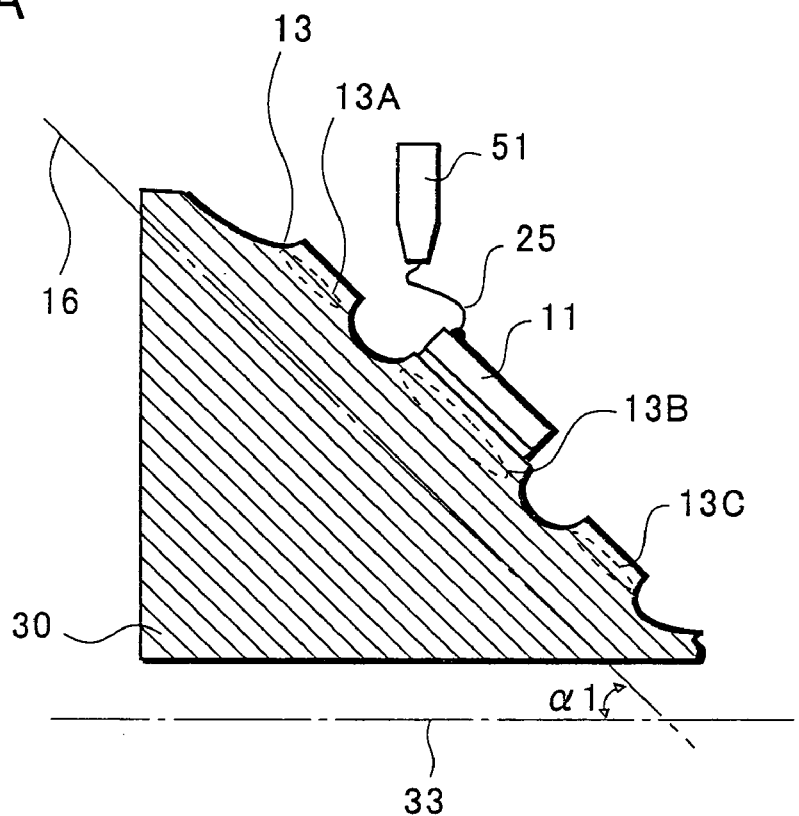
FIGS. 4A and 4B are cross-sectional views showing the circuit device manufacturing method of the embodiments of the present invention.
Figure 4B:
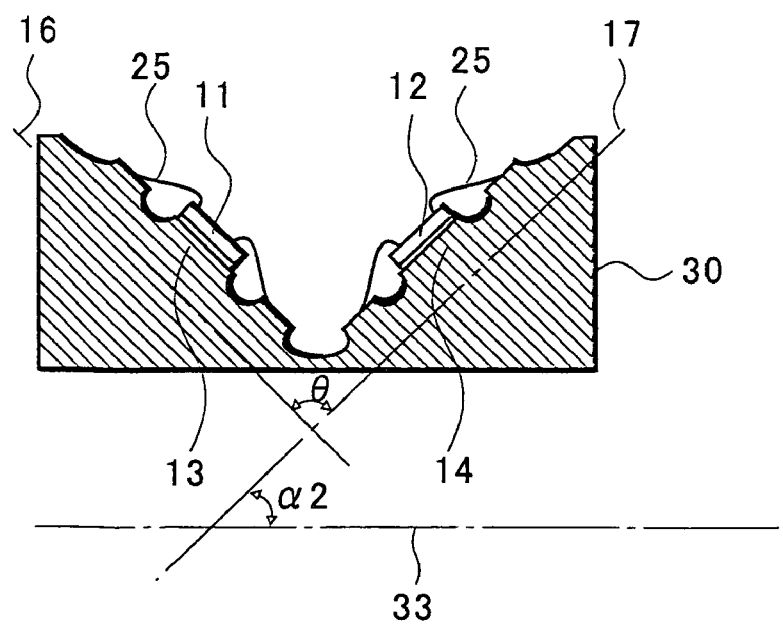

Next, referring to FIGS. 4A and 4B, the first element 11 and the first conductive pattern 13 are wire-bonded. Further, the second element 12 and the second conductive pattern 14 are wire-bonded. FIG. 4A is a view showing a situation in which a wire bonding is being performed on the first element 11, and FIG. 4B is a cross-sectional view showing a situation in which the wire bonding has been finished.

Referring to FIG. 4A, in this embodiment, the wire bonding is performed in a state in which the first conductive pattern 13 is tilted with respect to the horizontal plane. Specifically, an angle ($\alpha1$) of an intersection between a horizontal plane 33 and the first reference plane 16, to which the first conductive pattern 13 is formed parallel, is formed to be not more than 45 degrees. Accordingly, an angle formed by the horizontal plane 33 and each of a bonding pad 13A, a die pad 13B, a bonding pad 13C, and a main surface of the first element 11 is also formed to be not more than 45 degrees. Under these conditions, the first element 11 and the bonding pad 13A can be connected by performing a wire bonding using a thin metal wire 25. Specifically, the thin metal wire 25 is connected to an electrode (not shown) of the first element 11 by a ball boning using a capillary tip 51. Further, the thin metal wire 25 is connected to the bonding pad 13A by a stitch bonding. A similar operation is also performed between the first element 11 and the bonding pad 13C.

A bonder (not shown) which performs a wire bonding can perform a wire bonding without a problem if a tilt angle ($\alpha1$) of a plane with which the thin metal wire 25 comes into contact is not more than 45 degrees. If this tilt exceeds 45 degrees, a wire bonding becomes difficult. Accordingly, in this embodiment, setting the angle ($\alpha1$), which is formed by the first conductive pattern 13 and the horizontal plane, to 45 degrees or less makes it possible to perform a wire bonding in a state in which the entire conductive substrate 30 is kept horizontal. That is, a wire bonding can be performed without tilting the conductive substrate 30 in order to make a surface of the first conductive pattern 13 horizontal. Accordingly, a wire-bonding process can be simplified.

Referring to FIG. 4B, similar to the above, a wire bonding is also performed between the second conductive pattern 14 and the second element 12. Further, in a case where a wire bonding is performed on the second element 12, an angle $\alpha2$ at which the second reference plane 17 and the horizontal plane 33 intersect is set to 45 degrees or less.

In this embodiment, as one example, the first and second reference planes 16 and 17 are arranged to have a left-right symmetry so that an angle formed by the first and second reference planes 16 and 17 becomes 90 degrees. Accordingly, the above-described $\alpha1$ and $\alpha2$ become 45 degrees, and a wire bonding can be performed on tilted surfaces without tilting the conductive substrate 30.

Figure 5A:
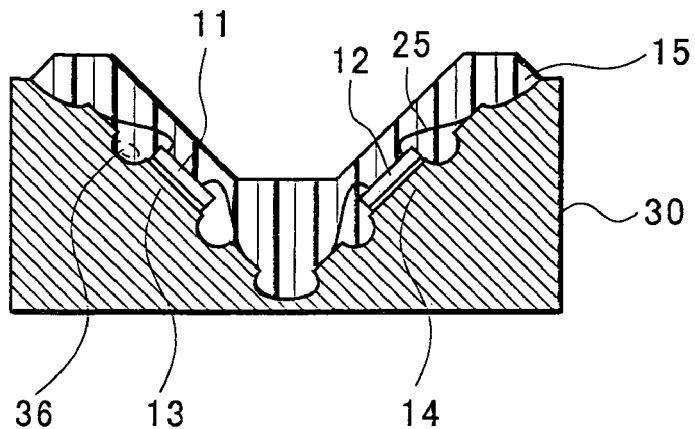
FIGS. 5A to 5C are cross-sectional views showing the circuit device manufacturing method of the embodiments of the present invention.
Figure 5B:
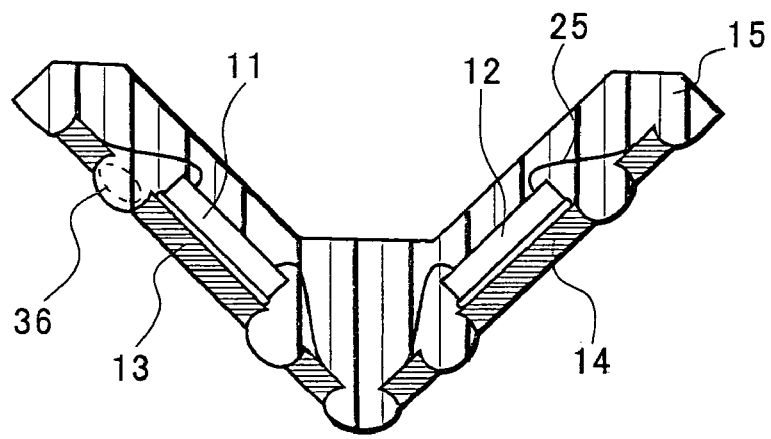
Figure 5C:
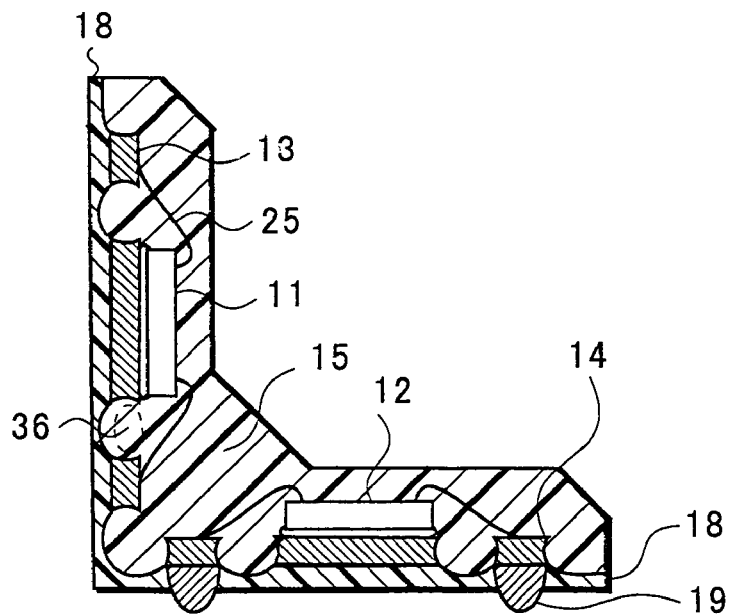

Next, referring to FIGS. 5A to 5C, a resin sealing and a conductive pattern removal are performed, and then external electrodes 19 are formed.

Referring to FIG. 5A, a sealing resin 15 is formed on the surface of the conductive substrate 30 so that the elements and the like are coated. Specifically, the sealing resin 15 is formed on the surface of the conductive substrate 30 so that the first and second elements 11 and 12, the first and second conductive patterns 13 and 14, and the thin metal wires 25 are coated. Further, the sealing resin 15 also fills the isolating grooves 36 formed between individual portions of the conductive patterns. The sealing resin 15 can be formed by a potting, a transfer molding, an injection molding, or the like. As a material for the sealing resin 15, a thermosetting resin such as an epoxy resin or a thermoplastic resin such as a polyimide resin can be employed.

Next, referring to FIG. 5B, the conductive substrate 30 is removed from a back surface thereof so that the individual portions of the conductive patterns are isolated from each other. Specifically, the conductive substrate 30 is removed until the sealing resin 15 filling the isolating grooves 36 is exposed and the individual portions of the first and second conductive patterns 13 and 14 are isolated from each other. In a removal of the conductive substrate 30, a wet etching may be performed after the back surface of the conductive substrate 30 is mechanically ground so that the conductive substrate 30 becomes evenly thinned. Alternatively, the conductive substrate 30 may be removed from the back surface thereof only by a wet etching.

Next, referring to FIG. 5C, a coating resin 18 and the external electrodes 19 are formed. First, the coating resin 18 is formed so that exposed surfaces of the first and second conductive patterns 13 and 14 are coated. Then, after a back surface of the second conductive pattern 14 is partially exposed from the coating resin 18, the external electrodes 18 are formed on exposed portions of the second conductive pattern 14. The external electrodes 19 can be formed by attaching a solder paste to exposed surfaces of the second conductive pattern 14 and then melting this solder paste.

By the above-described process, a circuit device 10A such as shown in FIGS. 1A and 1B is manufactured. Further, this circuit device is mounted on a mounting board, an inner wall of a set, or the like through the external electrodes. By mounting the circuit device 10A through the external electrodes 19, the main surface of the incorporated first element 11 can be placed perpendicular to a mounting surface.

Third Embodiment

In this embodiment, another method of manufacturing the circuit device described in the first embodiment will be described with reference to FIGS. 6A to 8C.

Figure 6A:
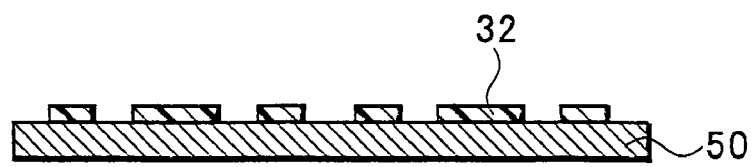
FIGS. 6A to 6D are cross-sectional views showing a circuit device manufacturing method of the embodiments of the present invention.

First, referring to FIG. 6A, a conductive foil 50 is prepared which is a material for conductive patterns. As a material for the conductive foil 50, a metal is employed which contains Cu, Al, an Fe—Ni alloy, or the like. A thickness of the conductive foil 50 may be arbitrarily set as long as it is more than depths of isolating grooves to be formed, and is specifically approximately 100 μm to 300 μm. On a surface of the conductive foil 50, a resist 32 is formed so that regions where conductive patterns are to be formed are coated.

Figure 6B:
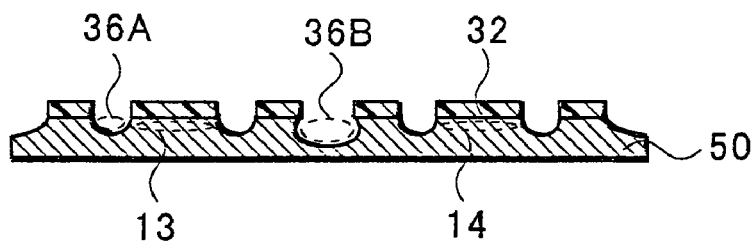

Next, referring to FIG. 6B, by performing a wet etching using the resist 32 as an etching mask, isolating grooves are formed in the surface of the conductive foil 50 to form conductive patterns having protruding shapes. Here, the conductive patterns include first and second conductive patterns 13 and 14. The first conductive pattern 13 is a pattern which is electrically connected to a first element in a later step. The second conductive pattern 14 is a pattern which is electrically connected to a second element in a later step.

By this step, first and second isolating grooves 36A and 36B are formed in the surface of the conductive foil 50. The first isolating grooves 36A are isolating grooves formed between individual portions of the first conductive pattern 13 or the second conductive pattern 14, and are formed in order to isolate the individual portions of the conductive patterns from each other. The second isolating groove 36B is formed in a region of the conductive foil 50 where the conductive foil 50 is to be bent. In this embodiment, the conductive foil 50 is bent at a boundary between the first and second conductive patterns 13 and 14. Accordingly, the second isolating groove 36B linearly extends along the boundary between the first and second conductive patterns 13 and 14.

As one example, widths of the first isolating grooves 36A are approximately 100 µm to 200 µm, and depths thereof are approximately 40 µm to 60 µm. On the other hand, for example, a width of the second isolating groove 36B is approximately 200 µm to 300 µm, and a depth thereof is approximately 60 µm to 80 µm.

Making the width and depth of the second isolating groove 36B sufficiently large makes it possible to prevent the conductive patterns from coming into contact with each other and short-circuiting each other in a later step in which the conductive foil 50 is bent at a portion where the second isolating groove 36B is provided.

In a comparison between the first and second isolating grooves 36A and 36B, the width of the second isolating groove 36B is preferably made larger than those of the first isolating grooves 36A. This makes it possible to prevent the conductive patterns from shorting each other when the conductive foil 50 is bent and to miniaturize the entire circuit device. For example, if the widths of the first and second isolating grooves 36A and 36B are made as large as approximately 300 µm, a short circuit can be prevented when the conductive foil 50 is bent, but a size of the entire circuit device may be increased because the individual portions of the conductive patterns are too distant from each other. On the other hand, making the widths of the first and second isolating grooves 36A and 36B as small as approximately 100 µm contributes to a miniaturization of the circuit device because the individual portions of the conductive patterns become close to each other, but the patterns may short-circuit each other when the conductive foil 50 is bent. Accordingly, the width of the second isolating groove 36B is preferably made larger than those of the first isolating grooves 36A.

However, if a short circuit between the conductive patterns at the time when the conductive foil 50 is bent does not become a problem, the widths of the first and second isolating grooves 36A and 36B may be made equal.

After this step is finished, the resist 32 is removed. Further, a plated film made of Au, Ag, or the like is formed on surfaces of the conductive patterns in regions where an element mounting and a wire bonding are performed.

Figure 6C:
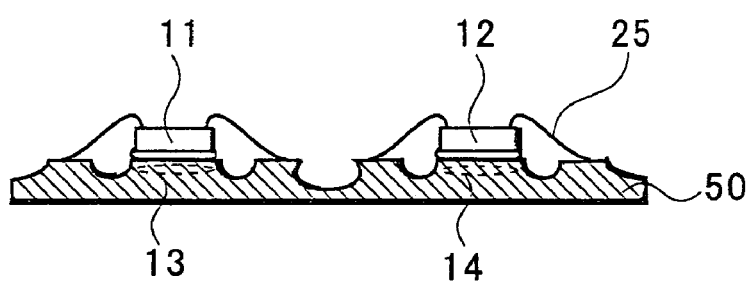

Next, referring to FIG. 6C, elements are electrically connected to the conductive patterns, respectively. Specifically, a first element 11 is fixed to a land-shaped portion of the first conductive pattern 13 with a fixing agent interposed therebetween. Here, as the fixing agent, solder, a conductive paste, or an insulating adhesive is employed. As the first element 11, an element which senses a physical quantity is employed as described previously. Electrodes (not shown) formed on a surface of the first element 11 are connected to pad-shaped portions of the first conductive pattern 13 by thin metal wires 25. Further, second element 12 is also fixed to a die-pad-shaped portion of the second conductive pattern 14, and connected to pad-shaped portions of the second conductive pattern 14 through the thin metal wires 25.

Figure 6D:
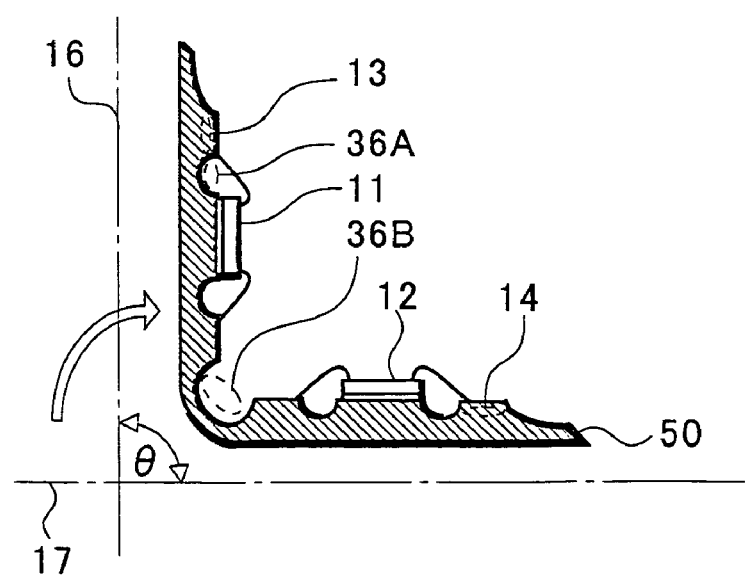

Next, referring to FIG. 6D, the conductive foil 50 is bent at a portion where the second isolating groove 36B is formed. As described previously, the second isolating groove 36B is formed to be sufficiently wide and deep. Accordingly, if the conductive foil 50 is bent, end portions of the conductive patterns do not come into contact with each other. Thus, a short circuit between the patterns is prevented.

By bending the conductive foil 50 in this way, the first and second elements 11 and 12 can be placed parallel to reference planes intersecting at a predetermined angle. Here, the reference plane to which a main surface of the first element 11 is placed parallel is referred to as a first reference plane 16, and the reference plane to which a main surface of the second element 12 is placed parallel is referred to as a second reference plane 17. By bending the conductive foil 50 at a predetermined position, the first and second reference planes 16 and 17 can be made to intersect at a predetermined angle ($\theta$). Here, as one example, the first and second reference planes 16 and 17 are made to intersect at a right angle ($\theta=90$ degrees). Accordingly, in a case where both the first and second elements 11 and 12 are gyro sensors, it becomes possible to detect angular velocities in both horizontal and vertical directions. The angle $\theta$ may be more than 90 degrees or less than 90 degrees.

Figure 7A:
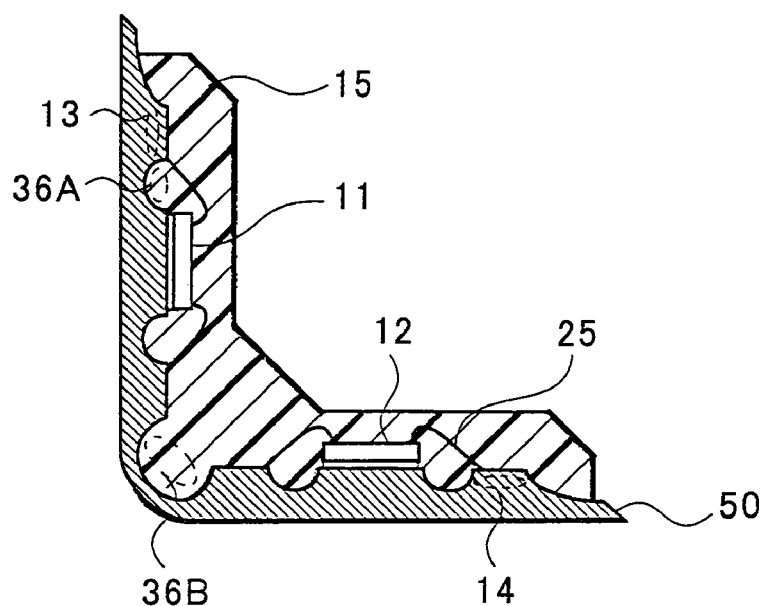
FIGS. 7A to 7C are cross-sectional views showing the circuit device manufacturing method of the embodiments of the present invention.

Next, referring to FIG. 7A, a sealing resin 15 is formed so as to fill the isolating grooves and coat the elements. Specifically, the sealing resin 15 is filled into the first and second isolating grooves 36A and 36B. Further, the sealing resin 15 is formed so as to coat the first and second elements 11 and 12 and the thin metal wires 25. The sealing resin 15 can be formed by a potting, a transfer molding, an injection molding, or the like. As a material for the sealing resin 15, a thermosetting resin such as an epoxy resin or a thermoplastic resin such as a polyimide resin can be employed.

Figure 7B:
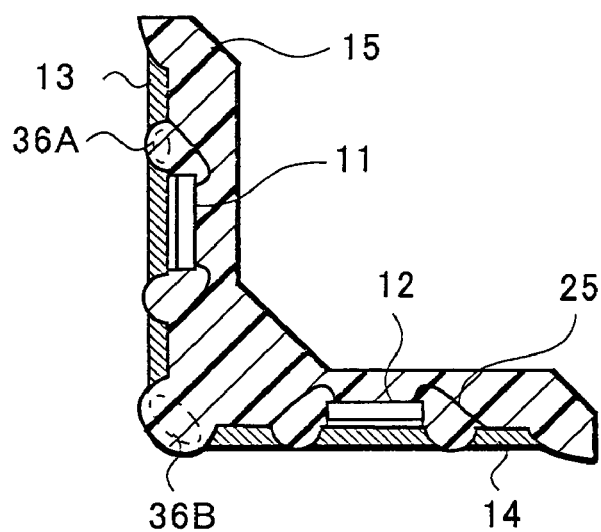

Next, referring to FIG. 7B, the conductive foil 50 is removed from a back surface thereof so that the individual portions of the conductive patterns are isolated from each other. Specifically, the conductive foil 50 is removed from the back surface thereof until the sealing resin 15 filling the first and second isolating grooves 36A and 36B is exposed and the individual portions of the first and second conductive patterns 13 and 14 are isolated from each other. In a removal of the conductive foil 50, a wet etching may be performed after the back surface of the conductive foil 50 is mechanically ground so that the conductive foil 50 becomes evenly thinned. Alternatively, the conductive foil 50 may be removed from the back surface thereof only by a wet etching.

Figure 7C:
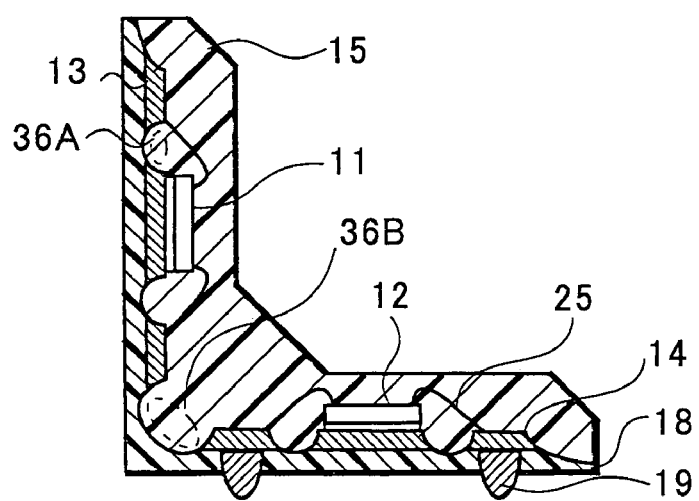

Next, referring to FIG. 7C, a coating resin 18 and external electrodes 19 are formed. First, the coating resin 18 is formed so that exposed surfaces of the first and second conductive patterns 13 and 14 are coated. Then, after a back surface of the second conductive pattern 14 is partially exposed from the coating resin 18, the external electrodes 19 are formed on exposed portions of the second conductive pattern 14. The external electrodes 19 can be formed by attaching a solder paste to exposed surfaces of the second conductive pattern 14 and then melting this solder paste.

By the above-described process, a circuit device 10A such as shown in FIGS. 1A and 1B is manufactured. Further, this circuit device is mounted on a mounting board, an inner wall of a set, or the like through the external electrodes 19. By mounting the circuit device 10A through the external electrodes 19, the main surface of the incorporated first element 11 can be placed perpendicular to a mounting surface.

Next, referring to the respective cross-sectional views shown in FIGS. 8A to 8C, another method of manufacturing the circuit device will be described. In the above-described manufacturing method, the individual portions of the conductive patterns are isolated from each other by removing the conductive foil 50 from the back surface thereof overall.

Here, the back surface of the conductive foil 50 is partially coated with a resist 27 and then an etching is performed, thereby forming a wiring pattern 22 which connects the first and second conductive patterns 13 and 14.

Figure 8A:
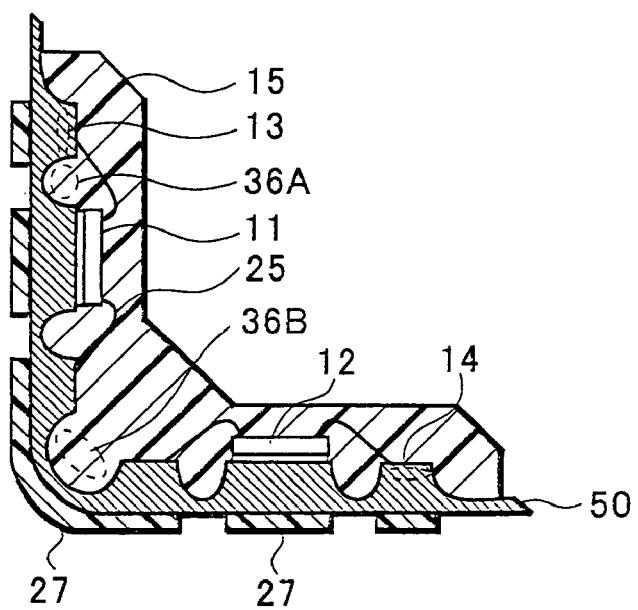
FIGS. 8A to 8C are cross-sectional views showing the circuit device manufacturing method of the embodiments of the present invention.

First, referring to FIG. 8A, the back surface of the conductive foil 50 is partially coated with the resist 27. Here, a resist 27A is partially formed on the back surface of the conductive foil 50 in a region corresponding to the second isolating groove 36B. This resist 27A is formed on the back surface of the conductive foil 50 so that a wiring pattern which connects desired portions of the first and second conductive patterns 13 and 14 is formed. Further, here, the back surface of the conductive foil 50 in regions corresponding to the first and second conductive patterns 13 and 14 is also coated with the resist 27.

Figure 8B:
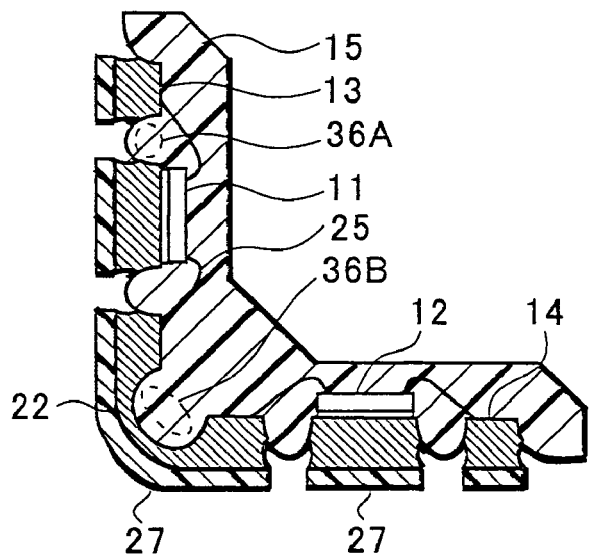

Next, referring to FIG. 8B, the individual portions of the conductive patterns are isolated from each other by performing a wet etching using the resist 27 as an etching mask. Here, since the etching is performed in a state in which back surfaces of the conductive patterns are coated, the back surfaces of the first and second conductive patterns 13 and 14 protrude from a back surface of the sealing resin 15 to an outside. Moreover, the conductive foil 50 in a region coated with the resist 27A is not removed by the etching but is left as the wiring pattern 22. The wiring pattern 22 extends so as to connect the first and second conductive patterns 13 and 14.

Figure 8C:
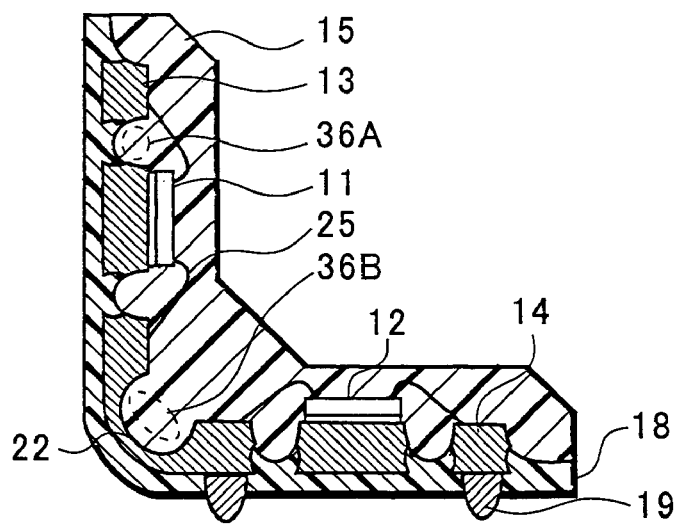
Figure 9:
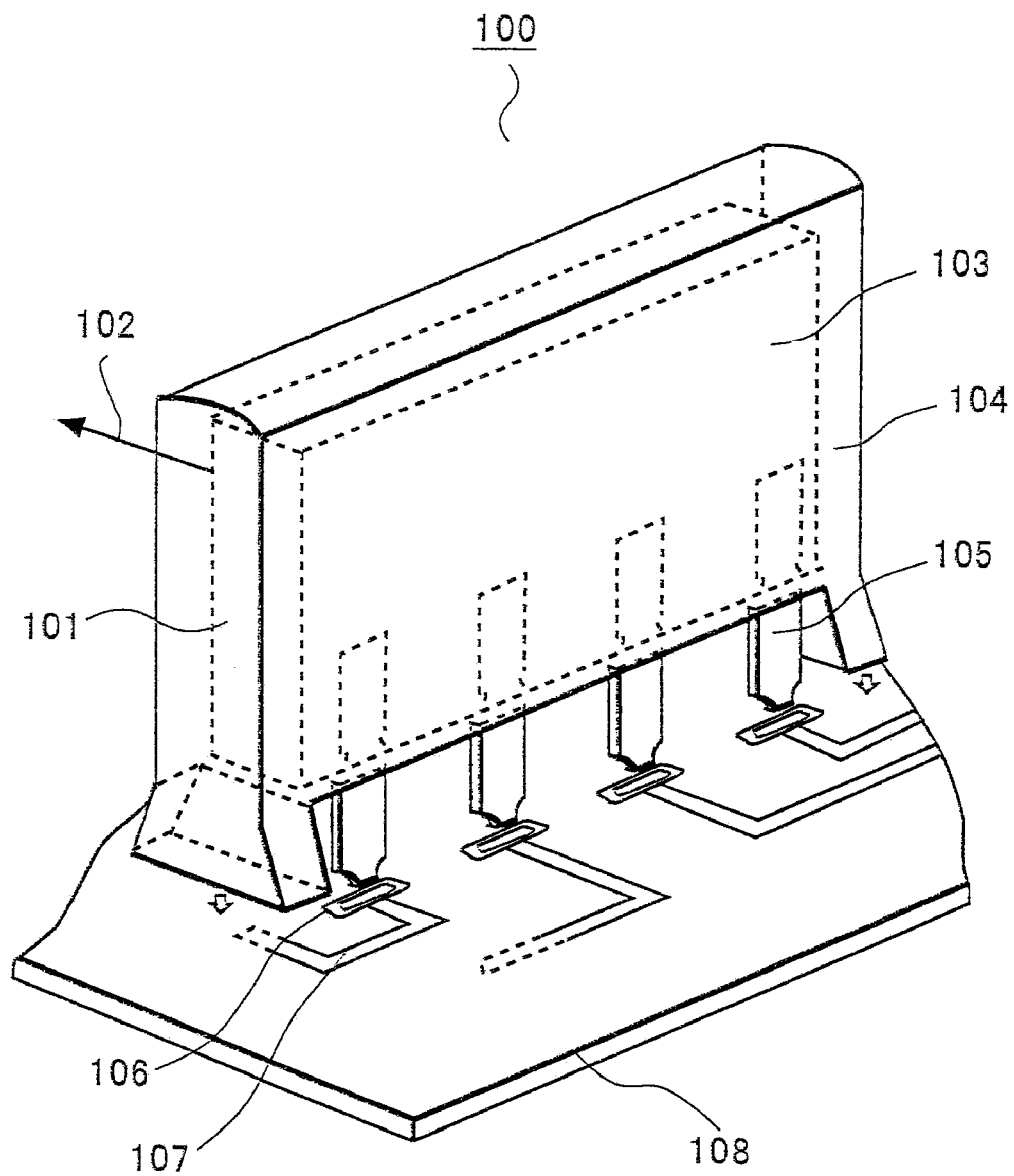
FIG. 9 is a perspective view showing a conventional circuit device.

Next, referring to FIG. 8C, the exposed first and second conductive patterns 13 and 14 and the exposed wiring pattern 22 are coated with the coating resin 18. Further, the back surface of the second conductive pattern 14 is partially exposed from the coating resin 18, and the external electrodes 19 are formed.

According to the circuit device of the embodiments of the present invention, the first element which senses a physical quantity and the second element are integrally coated with the sealing resin. Accordingly, it becomes possible to incorporate a plurality of elements including the first element which senses a physical quantity into one circuit device, and an area necessary to mount an element can be reduced. Thus, it is possible to miniaturize an entire set, such as a video camera, in which the circuit device is incorporated.

Further, in the circuit device of the embodiments of the present invention, there are no lead insertion portions. Accordingly, it is possible to improve a connection reliability for external forces such as thermal stresses.

According to the circuit device manufacturing method of the embodiments of the present invention, the first and second elements are placed at predetermined angles with respect to different reference planes, and then both the elements are integrally sealed with a resin. Accordingly, a circuit device can be obtained in which a plurality of elements placed at predetermined angles with respect to different reference planes are sealed with a resin.

Moreover, according to the circuit device manufacturing method of the embodiments of the present invention, the first and second conductive patterns are formed on a surface of one conductive substrate at predetermined angles, an element mounting and a resin sealing are performed, and then the individual portions of the conductive patterns are isolated from each other by removing the back surface of the conductive substrate. Accordingly, the first and second conductive patterns extending in different planes can be manufactured from the same conductive substrate. Thus, a manufacturing process can be simplified.

Furthermore, a wire bonding can be performed directly on the first and second conductive patterns, which are tilted surfaces, by placing the first and second conductive patterns in planes which intersect the horizontal plane at angles of not more than 45 degrees. Accordingly, there is no need to tilt the conductive substrate itself in order to make extension directions of the conductive patterns horizontal. Thus, a process for performing a wire bonding can be simplified.

According to the circuit device manufacturing method of the embodiments of the present invention, a circuit device can be manufactured in which a plurality of elements including an element placed at a predetermined angle with respect to a mounting surface of the circuit device are integrally sealed with the sealing resin.

Further, according to the circuit device manufacturing method of the embodiments of the present invention, an angle of an incorporated element with respect to the mounting surface can be arbitrarily set by adjusting an angle at which the conductive foil is bent.

Moreover, according to the circuit device manufacturing method of the embodiments of the present invention, an element placed perpendicular to the mounting surface of the circuit device can be incorporated into the device by bending the conductive foil at a right angle.

Furthermore, according to the circuit device manufacturing method of the embodiments of the present invention, the first element which detects a physical quantity and the second element are integrally coated with the sealing resin. Accordingly, it becomes possible to incorporate a plurality of elements including the first element which detects a physical quantity into one circuit device, and an area necessary to mount an element can be reduced. Thus, it is possible to miniaturize an entire set, such as a video camera, in which the circuit device is incorporated.

What is claimed is:

1. A circuit device comprising:
   a first element placed at a predetermined angle with respect to a first reference plane, the first element sensing a physical quantity;
   a second element placed at a predetermined angle with respect to a second reference plane intersecting the first reference plane;
   a sealing resin for integrally sealing the first and second elements;
   a first conductive pattern electrically connected to the first element and placed at a predetermined angle with respect to the first reference plane, the first conductive pattern having a back surface exposed from the sealing resin; and
   a second conductive pattern electrically connected to the second element and placed at a predetermined angle with respect to the second reference plane, the second conductive pattern having a back surface exposed from the sealing resin.

2. The circuit device according to claim 1, wherein the first and second reference planes intersect at a right angle.

3. The circuit device according to claim 1, further comprising: a wiring pattern for connecting the first and second conductive patterns.

4. The circuit device according to claim 1, wherein the second element is configured to be mounted to a mounting board.

* * * * *